(12) United States Patent
Bharath et al.

(10) Patent No.: US 7,378,874 B2
(45) Date of Patent: May 27, 2008

(54) CREATING HIGH-DRIVE LOGIC DEVICES FROM STANDARD GATES WITH MINIMAL USE OF CUSTOM MASKS

(75) Inventors: Bhaskar Bharath, Cary, NC (US); William D. Cox, Chapel Hill, NC (US)

(73) Assignee: ViASIC, Inc., Durham, NC (US)

( * ) Notice: Subject to any disclaimer, the term of this patent is extended or adjusted under 35 U.S.C. 154(b) by 93 days.

(21) Appl. No.: 11/469,189

(22) Filed: Aug. 31, 2006

(65) Prior Publication Data

US 2008/0054939 A1   Mar. 6, 2008

(51) Int. Cl.
*H03K 19/173* (2006.01)

(52) U.S. Cl. .................. 326/47; 326/41; 326/101; 716/12; 716/17

(58) Field of Classification Search .................. 326/41, 326/47, 101; 716/12, 17
See application file for complete search history.

(56) References Cited

U.S. PATENT DOCUMENTS

| | | | |
|---|---|---|---|
| 5,068,603 A | 11/1991 | Mahoney | |
| 5,815,004 A | 9/1998 | Trimberger et al. | |
| 5,815,726 A | 9/1998 | Cliff | |
| 5,825,202 A | 10/1998 | Tavana et al. | |
| 5,874,834 A | 2/1999 | New | |
| 5,898,318 A | 4/1999 | Pedersen | |
| 5,905,385 A | 5/1999 | Sharpe-Geisler | |
| 5,999,015 A | 12/1999 | Cliff et al. | |
| 6,014,038 A | 1/2000 | How et al. | |
| 6,020,755 A | 2/2000 | Andrews et al. | |
| 6,078,191 A * | 6/2000 | Chan et al. | .................. 326/40 |
| 6,150,837 A | 11/2000 | Beal et al. | |
| 6,194,912 B1 | 2/2001 | Or-Bach | |
| 6,236,229 B1 | 5/2001 | Or-Bach | |
| 6,245,634 B1 | 6/2001 | Or-Bach | |
| 6,294,927 B1 | 9/2001 | Yoeli et al. | |
| 6,331,733 B1 | 12/2001 | Or-Bach et al. | |
| 6,331,789 B2 | 12/2001 | Or-Bach | |
| 6,331,790 B1 | 12/2001 | Or-Bach et al. | |
| 6,492,833 B1 | 12/2002 | Asson et al. | |
| 6,507,216 B1 | 1/2003 | Lane et al. | |
| 6,580,289 B2 | 6/2003 | Cox | |
| 6,693,454 B2 | 2/2004 | Cox | |
| 6,696,856 B1 | 2/2004 | Smith et al. | |
| 6,780,745 B2 * | 8/2004 | Shoji et al. | .................. 438/598 |
| 6,873,185 B2 | 3/2005 | Cox | |
| 7,073,157 B2 * | 7/2006 | DeHon et al. | .................. 716/17 |
| 2004/0027156 A1 | 2/2004 | Amarilio et al. | |

* cited by examiner

*Primary Examiner*—Vibol Tan
(74) *Attorney, Agent, or Firm*—Tillman Wright, PLLC; James D. Wright; Chad D. Tillman

(57) ABSTRACT

Logic cells in an application-specific integrated circuit (ASIC) emulating standard gate sizing by duplicating elements within a single standard gate where logical high-drive gates are synthesized and converted to parallel elements as a post-process. The drive characteristics of the logical gates are retained during the conversion to the physical gate equivalents in the standard cell architecture. The logic cells in the device may include, for example, at least two two-input multiplexers.

30 Claims, 9 Drawing Sheets

30

32

CREATING HIGH-DRIVE LOGIC DEVICES FROM STANDARD GATES WITH MINIMAL USE OF CUSTOM MASKS

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The present invention relates generally to semiconductor devices, and, in particular, to a "one-mask" architecture that uses a plurality of similar basic logic devices to produce a "high-drive" logic device having a function identical to that of the basic logic devices.

BACKGROUND

For many years, gate arrays have been used to provide quick-turnaround (quick-turn), low non-recurring-expense (NRE) semiconductor devices for a variety of purposes. Traditionally, semiconductor wafers are processed up to but not including the first (bottom) metal layer, and saved in inventory. When a customer orders a semiconductor device to be fabricated for a specific application (an application-specific integrated circuit or "ASIC"), the customer only pays for the masks to configure the metal layers, and not the transistor layers below. Thus, NRE is reduced. The wafers can be completed quickly, since only the metal layers remain to be fabricated, reducing turn-around time.

Recently more and more layers of metal have been incorporated into gate array semiconductor devices. Rather than two or three layers of metal, six to eight layers of metal are now common. As a result, gate arrays are often no longer very low-NRE, or quick-turn. In order to regain the advantages of earlier gate arrays, several vendors have developed logic arrays, consisting of multiple, substantially identical logic cells, which can be configured for an application with fewer or cheaper masks. In the case of fewer masks, the total number of metal layers and hence masks used to create the finished device often does not change. Rather, only a reduced subset of the total number of metal layers in a finished device is used to impart the custom configuration to the device. For example, so-called "one-mask" devices, in which only a single metal layer and hence a single mask imparts customization, can in theory reduce both NRE and turn-time.

In general, ASICs combine large numbers of programmable blocks of logic circuits into logic cells to create a semiconductor device that is specifically adapted for a particular application. Traditionally, the different programmable blocks of logic circuits are predefined logic gates called standard cells. A set of standard cells is then defined as a "library." The function of each ASIC is dependent on which logic gates are selected from the standard cell library and how they are combined. The functionality of the ASIC is enhanced, however, by improving the speed of the electric signals that flow through and between the logic gates chosen from the library of standard cells, and thus timing is almost always a critical issue in the design of a particular ASIC. To help address this, libraries in many cases contain standard cells that provide different levels of drive strength to allow the designer (or specialized software, usually referred to as "synthesis" software, that converts the functional design for the ASIC into a physical design) to choose a standard cell with a drive strength that is high enough to generate an electric signal that is fast enough to meet the timing requirements of the completed semiconductor device. In order to accomplish this, these larger logic devices generally use greater amounts of power to deliver higher current and thus a higher drive strength and faster signal. Unfortunately, it is difficult to anticipate the precise need for such high drive logic devices in the standard, non-customizable layers of the ASIC, and thus additional customization to one or more layers is thus often required. Alternatively, specialized logic devices may be custom designed, but once again, such designs require more customized metal masks in order to provide the logical function with the drive strength required. In either case, these additional customized masks produce higher NRE.

As described previously, "one-mask" standard-metal designs, a class of ASICs, are preferable in some ways because most or all physical logic (gates) and metal are predefined, and various logical designs may be implemented by customizing just a single mask instead of a complete mask set, thereby reducing NRE. However, since only one or a couple of layers is customizable and the gates are pre-defined, the number of different logic gates available in the standard cell library for such an ASIC is more limited, and it may not be possible to include specialized high-drive gates in the types or quantities desired. Thus, a need exists for an approach for creating high-drive gates from the basic physical logic gates, together with whatever metal routing is available, that are already found in the logic cells of the ASIC.

SUMMARY OF THE PRESENT INVENTION

The present invention comprises an architecture for gate-array type devices, such as ASIC's, that is used at both the individual cell level and the chip level. The architecture of the invention has a number of features that are advantageous in terms of speed, density, and efficiency, especially with regard to the use of high-drive devices in the architecture.

In some embodiments, a semiconductor device comprising an array of logic cells and programmable metal includes one or more gate structures that are pre-wired in a first process geometry, where a plurality of inputs and/or outputs of the gate structures are available for routing in at least two layers of the programmable metal, where the programmable metal is in a second process geometry.

The present invention provides for the incorporation of high-drive logic cells into "one-mask" standard-metal designs using multiple gates chosen to be in the same "logical cell", the base unit of a one-mask ASIC. It is necessary to convert the logic cell to a physical cell that represents the same logical function. Heuristics may be used to determine this mapping to guarantee the drive strength of the physical cell is equal to the drive strength defined in the logic cell.

In some embodiments these logical cells containing multiple gates built in parallel must be placed in close proximity to the other logical cells that they drive to maintain timing requirements. Buffers, gates added or removed so that timing closure is achieved and electro-migration does not occur, are considered during this placement.

Broadly defined, the present invention according to one aspect is a semiconductor device, including: a plurality of non-customized layers in which are arranged an array of logic cells and no more than two customized layers, disposed on top of the plurality of non-customized layers, for routing connections. Each of at least some of the logic cells in the array includes a first pre-wired logic device and a second pre-wired logic device, the second logic device being functionally equivalent to the first logic device. The customized layers configure the first and second pre-wired logic devices into a high-drive logic device, the high-drive logic device being functionally equivalent to each of the first and second logic devices, by connecting the first and second pre-wired logic devices together in parallel.

In features of this aspect, the device is an application-specific integrated circuit, and the first and second pre-wired logic devices are configured into the high-drive logic device using only one customized layer, which may be a customized via layer. In another feature of this aspect, the first pre-wired logic device is selected from a group consisting of a NAND, a multiplexer, a FLOP, an inverter, an XOR, a NOR, and a look-up table, and the second pre-wired logic device is substantially the same as the first pre-wired logic device. In a more specific feature, the first and second pre-wired logic devices are each a multiplexer having a D0 input, a D1 input, a SEL input, and a Z output, and the first and second pre-wired logic devices are configured, using the customized via layer, to be connected to a common D0 input, a common D1 input, a common SEL input, and a common Z output.

In other features of this aspect, the customized layers include two customized via layers, the customized layers include one customized via layer and one customized metal layer, or the customized layers include two customized metal layers.

In still another feature of this aspect, the array of logic cells are fabricated in a first process geometry, and the customized layers are fabricated in a second process geometry.

In another aspect, the present invention is a method of making a semiconductor device, including: forming a plurality of non-customized layers in which are arranged an array of logic cells, wherein each of at least some of the logic cells in the array includes a first pre-wired logic device and a second pre-wired logic device, the second logic device being functionally equivalent to the first logic device; and forming no more than two customized layers, for routing connections, on top of the plurality of non-customized layers. The step of forming the customized layers includes producing a respective customized mask for each customized layer, the customized masks for configuring the first and second pre-wired logic devices into a high-drive logic device, the high-drive logic device being functionally equivalent to each of the first and second logic devices, by connecting the first and second pre-wired logic devices together in parallel, and forming each of the no more than two customized layers using the respective customized mask.

In features of this aspect, the device is an application-specific integrated circuit, only one customized mask, which may be a customized via layer, is produced, and only one customized layer is formed, using the one customized mask, to configure the first and second pre-wired logic devices into the high-drive logic device that is functionally equivalent to each of the first and second logic devices. Forming the customized via layer includes forming connections between routing tracks in non-customized layers. In another feature of this aspect, forming the plurality of non-customized layers includes selecting the first pre-wired logic device from a group consisting of a NAND, a multiplexer, a FLOP, an inverter, an XOR, a NOR, and a look-up table, and selecting the second pre-wired logic device to be the same type of device as the first logic device. In a more specific feature of this aspect, each of the first and second pre-wired logic devices is a multiplexer having a D0 input, a D1 input, a SEL input, and a Z output, and forming the customized via layer includes connecting the first and second pre-wired logic devices to a common D0 input, a common D1 input, a common SEL input, and a common Z output.

In other features of this aspect, forming no more than two customized layers includes forming two customized via layers, or one customized via layer and one customized metal layer, or two customized metal layers.

In still another feature of this aspect, forming the plurality of non-customized layers includes fabricating the plurality of non-customized layers in a first process geometry, and forming the no more than two customized layers includes fabricating the no more than two customized layers in a second process geometry.

In still another aspect, the present invention is a semiconductor chip, including an array of logic cells, arranged in a plurality of non-customized layers, that are disposed to receive configurable metal, at least some of the logic cells in the array including a first pre-wired logic device and a second pre-wired logic device, the second logic device being functionally equivalent to the first logic device, wherein the first and second pre-wired logic devices in each logic cell can be selectively connected together in parallel to form a high-drive logic device, functionally equivalent to each of the first and second logic devices, by routing in no more than two customized layers in the configurable metal.

In features of this aspect, the chip is part of an application-specific integrated circuit, and the first and second pre-wired logic devices can be selectively connected together in parallel to form a high-drive logic device using only one customized layer, which may be a via layer. In another feature of this aspect, the first pre-wired logic device is selected from a group consisting of a NAND, a multiplexer, a FLOP, an inverter, an XOR, a NOR, and a look-up table, and the second pre-wired logic device is substantially the same as the first pre-wired logic device. In a more specific feature, the first and second pre-wired logic devices are each a multiplexer having a D0 input, a D1 input, a SEL input, and a Z output, and the first and second pre-wired logic devices can be selectively connected together in parallel, using the customized via layer, such that the first and second pre-wired logic devices are connected to a common D0 input, a common D1 input, a common SEL input, and a common Z output.

In other features of this aspect, the first and second pre-wired logic devices can be selectively connected together in parallel to form a high-drive logic device using only two customized via layers, or only one customized via layer and one customized metal layer, or only two customized metal layers.

In still another feature of this aspect, the array of logic cells is fabricated in a first process geometry, and wherein the configurable metal of the customized layers can be fabricated in a second process geometry.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
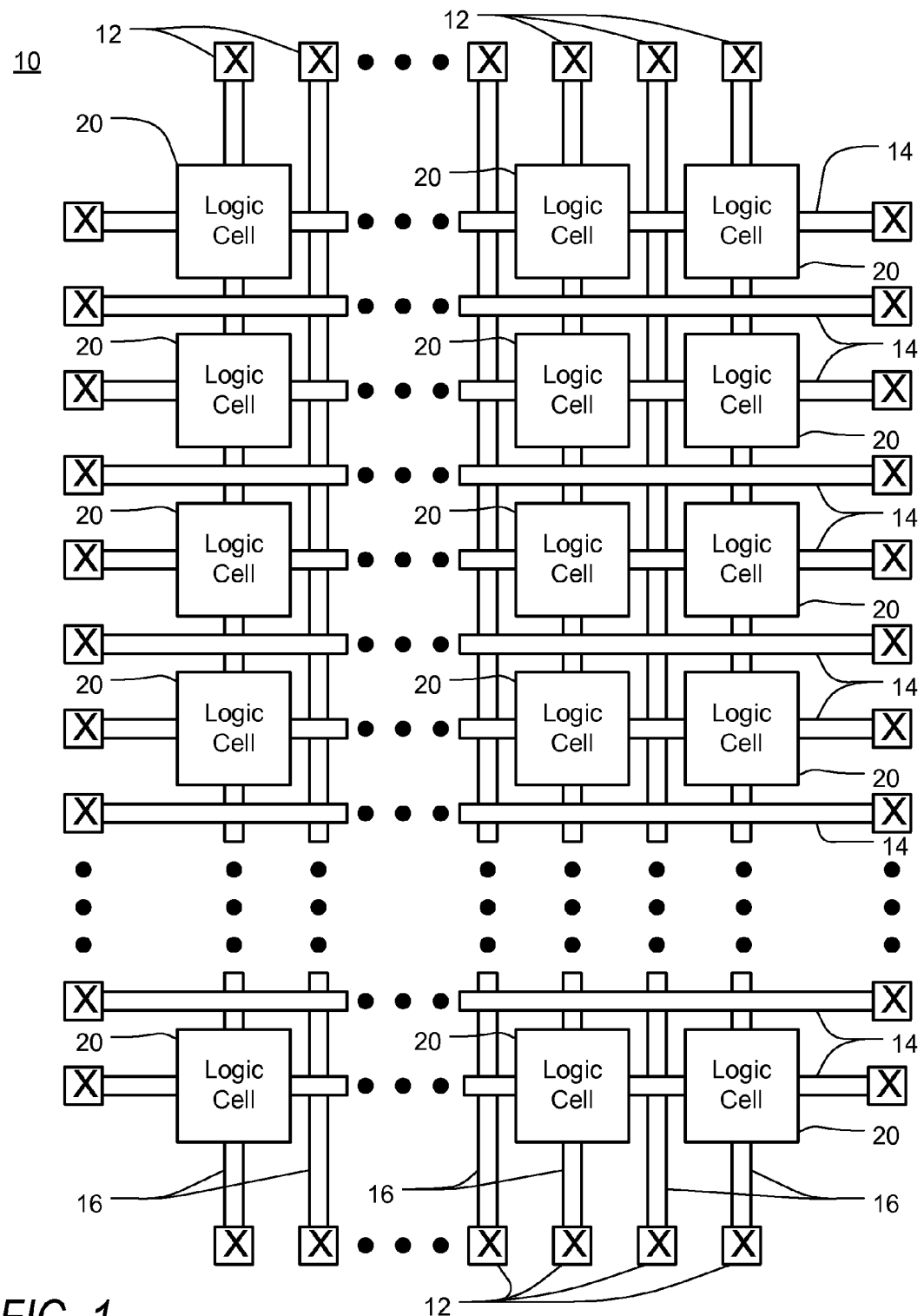
FIG. 1 is a block diagram representing the general architecture of an ASIC.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Further, the meaning of certain terms as used in the context of this disclosure should be understood as follows. The term "configuration" and variants such as "configurable" and "configured" refer to the property or process of imparting application-specific function to an integrated circuit chip. The term "metal layer" refers to any layer that is used to make connections to implement the functions of the cells of a device. These metal layers may be the same for every version of a semiconductor device, or they may be used for configuration. In addition, metal layers may contain actual metal routing traces or vias, which provide vertical connectivity between metal routing layers. Finally, the term "chip" and variations such as "integrated circuit chip" or "semiconductor chip" are normally meant to refer to an intermediate device that has not been configured, and may be in the form of a wafer. A finished device such as an ASIC will be referred to as a "device" or with a variant term such as "semiconductor device" or the like. Other terms will either be discussed when introduced, or otherwise should be assumed to have the conventional meaning as understood by persons of ordinary skill in the art.

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

The present invention relates to aspects of a cell architecture for an ASIC that reduces the number of custom masks required, representing significant cost and time savings. In some embodiments, only one custom via mask and no custom metal masks are required; however, in other embodiments, only two custom via masks and no custom metal masks are required; in still other embodiments, only one custom metal mask and one custom via mask are required; in yet still other embodiments, only two custom metal masks and no custom via masks are required. The choice of whether to use one mask or two is typically dependent upon the tradeoff between cost and performance. When cost is the primary issue, it is generally preferred that only a single custom via mask be used, and no custom metal masks are used. On the other hand, if the desired level of performance is not achievable using only a single custom via mask, a two mask solution may be used.

As will be apparent to the Ordinary Artisan, each via mask determines where the so-called "vias" will be placed to make connections between layers. By using such an architecture, the semiconductor manufacturer may invest in the generic or base masks just one time. Various designs are then implemented by customizing just a via mask (and perhaps a second via mask or a metal mask) instead of a complete mask set. Many aspects of such an architecture is described in commonly-assigned U.S. Pat. No. 6,580,289 to Cox, the entirety of which is incorporated herein by reference.

FIG. 1 is a block diagram representing the general architecture of an ASIC 10 as described in the foregoing patent. As more fully described therein, an ASIC has rows and columns of logic cells 20, where each cell 20 may implement a plurality of gates worth of logic. The number of gates in each cell 20 may be defined by the designer, but conventionally each cell 20 may comprise eight or ten ASIC gates arranged into one or more logic devices. Horizontal routing tracks 14 and vertical routing tracks 16 connect the logic cells 20 together. These tracks 14,16 are formed of segmented wires of fixed length that may be connected to each other through vias 22, which are shown in more detail in FIG. 2. The inputs and outputs of the logic cells 20 communicate using routing tracks 14,16 that are connected through the vias 22. Some of the routing tracks 14,16 may also connect to pads 12, typically arranged around the edge of the die, that permit external connections to be made to the logic devices in the ASIC 10.

Figure 2:
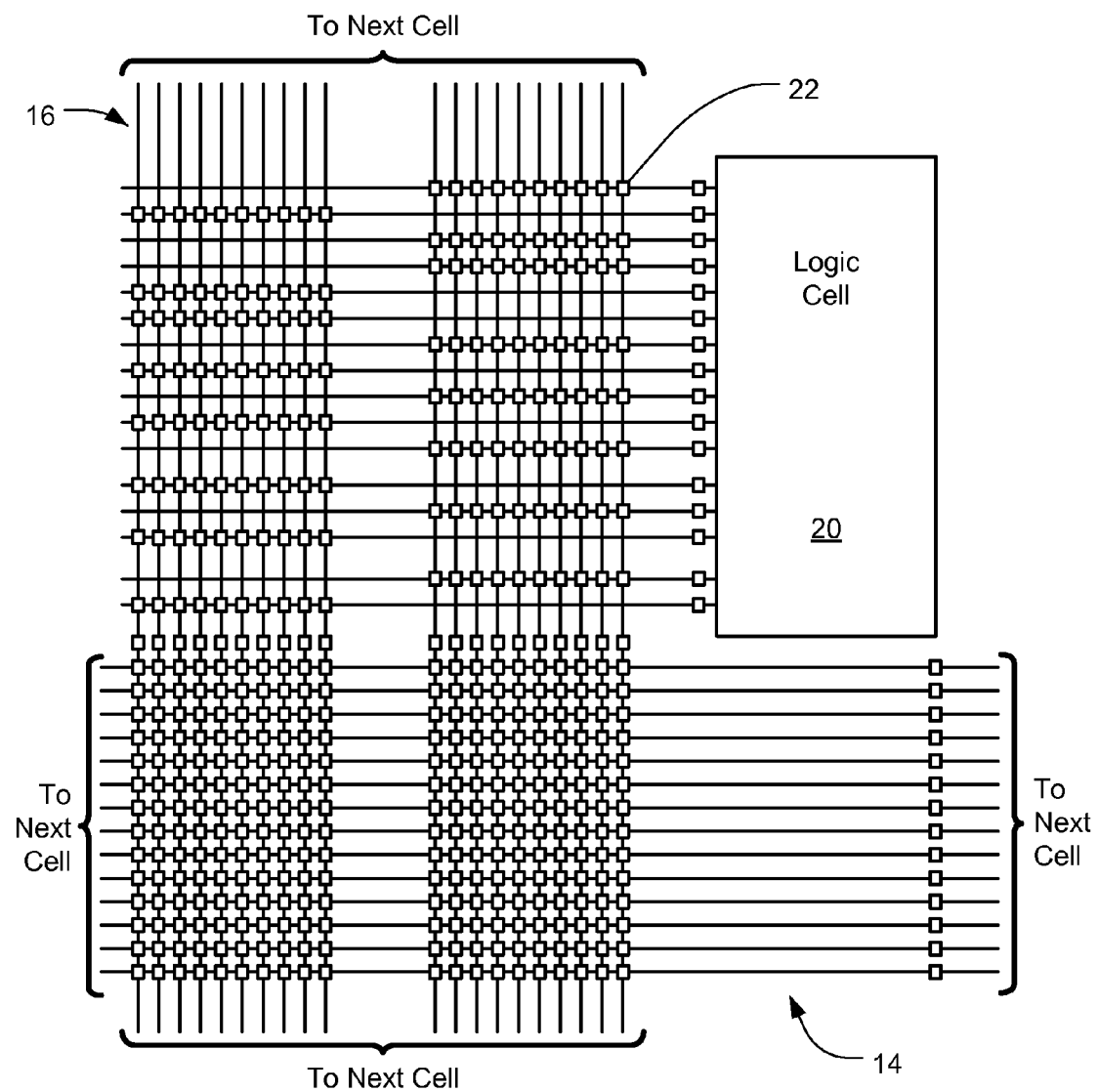
FIG. 2 is a schematic diagram illustrating how a single logic cell connects to surrounding cells.

FIG. 2 is a schematic diagram illustrating how a single logic cell 20 connects to surrounding cells (not shown in FIG. 2). The logic cell 20 is connected to the other logic cells in the array using the horizontal and vertical routing tracks 14,16, which in FIG. 2 include twenty vertical and fourteen horizontal segmented lines. The various routing tracks 14,16 are generally located in a plurality of different metal layers. Where routing tracks 14,16 in one layer pass over or under routing tracks 14,16 in another layer, vias 22 are used to electrically connect them. Of course, not all of the vias 22 illustrated in FIG. 2 are likely to be used in the design of an actual ASIC 10; instead, the illustrated vias 22 merely represent some possible via locations. The actual vias 22 utilized will be dependent on the particular design being implemented in the ASIC 10. Furthermore, it will be understood that the arrangement of the cell 20 and the various routing tracks 14,16 shown in FIG. 2 is only a logical representation meant to generally illustrated the use of horizontal and vertical routing tracks 14,16. In an actual ASIC 10, the horizontal and vertical routing tracks 14,16 typically overlays the logic cells 20, and are conventionally aligned with jumpers, routing tracks, and other connection points in the logic cell to facilitate connection thereto. In an actual ASIC 10, the horizontal and vertical routing tracks 14,16 are typically internal to the logic cells 20, and are conventionally aligned with jumpers, routing tracks, and other connection points in the logic cell to facilitate connection thereto.

Figure 3:
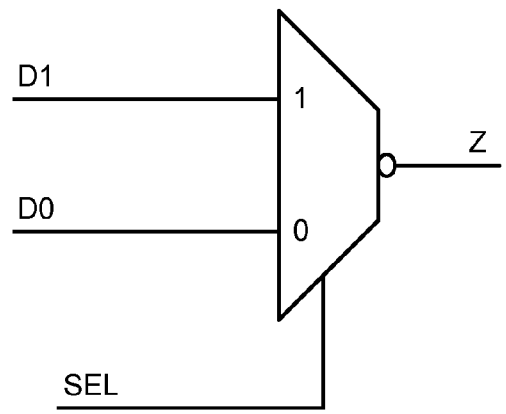
FIG. 3 is a schematic diagram of an exemplary logic device that may be contained in one of the logic cells of FIG. 1.

FIG. 3 is a schematic diagram of an exemplary logic device 30 that may be contained in one of the logic cells 20 of FIG. 1. This exemplary logic device 30 is a simple 2-to-1 multiplexor, referred to generally hereinafter as a "MUX," but it will be understood that the present invention will be equally applicable to a wide variety of other types of logic devices (not shown), such as a NAND, a FLIP-FLOP, an inverter, an XOR, a NOR, and a look-up table, the design and operation of each of which will be apparent to the Ordinary Artisan. The MUX has been selected merely as a particularly suitable illustration of the usefulness of the present invention. As is well known, a MUX is used to connect one input, selected from a plurality of inputs (in this case, two inputs), to a single output. The two data inputs are referred to herein as "D0" and "D1," and a third input, referred to as "SEL," selects between the two. The output is referred to herein as "Z." Although not illustrated, a MUX conventionally uses other inputs, such as VDD and VSS, to control input and output levels; these inputs are hardwired into the logic cell 20.

Figure 4:
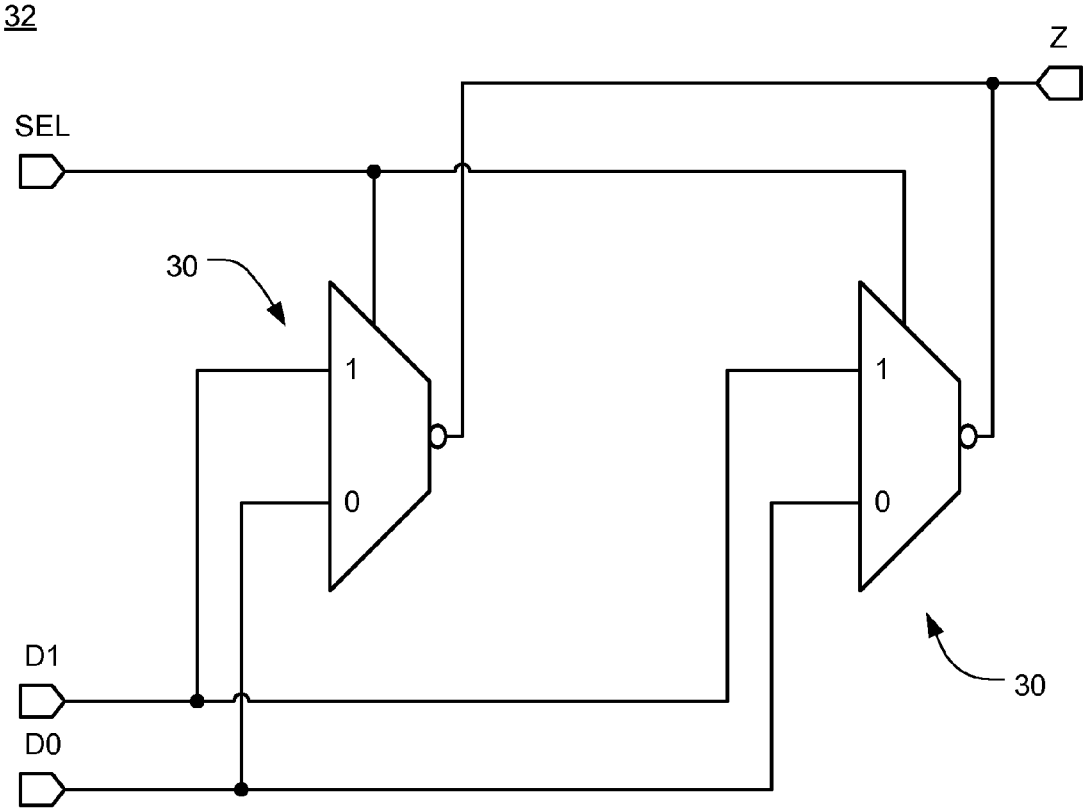
FIG. 4 is a schematic diagram of a pair of logic devices in accordance with an exemplary preferred embodiment of the present invention.

FIG. 4 is a schematic diagram of a pair of logic devices 30 in accordance with an exemplary preferred embodiment of the present invention. In FIG. 4, two of the logic devices 30 of FIG. 3 have been arranged into an exemplary "high-drive" logic device 32. Each MUX 30 has three logic inputs, once again referred to herein as "D0," "D1," and "SEL," with each MUX 30 receiving the same three inputs from the same three sources. Once again, the VDD and VSS signals are hard-wired into the logic cell 20 and are not shown. Each MUX 30 produces one logic output signal, referred to herein as "Z." The Z outputs from the two MUXs 30 are tied together. When wired this way, a higher-order logic device is created that performs that functionality of a two-input MUX but with a higher-powered output than that available from a single MUX logic device 30. This high-drive logic device 32 can be very useful in meeting timing and other physical requirements. Further, although not shown, still more logic devices 30 may be combined with the first two devices to create a still higher-powered device, and corresponding output signal, if desired.

Figure 5:
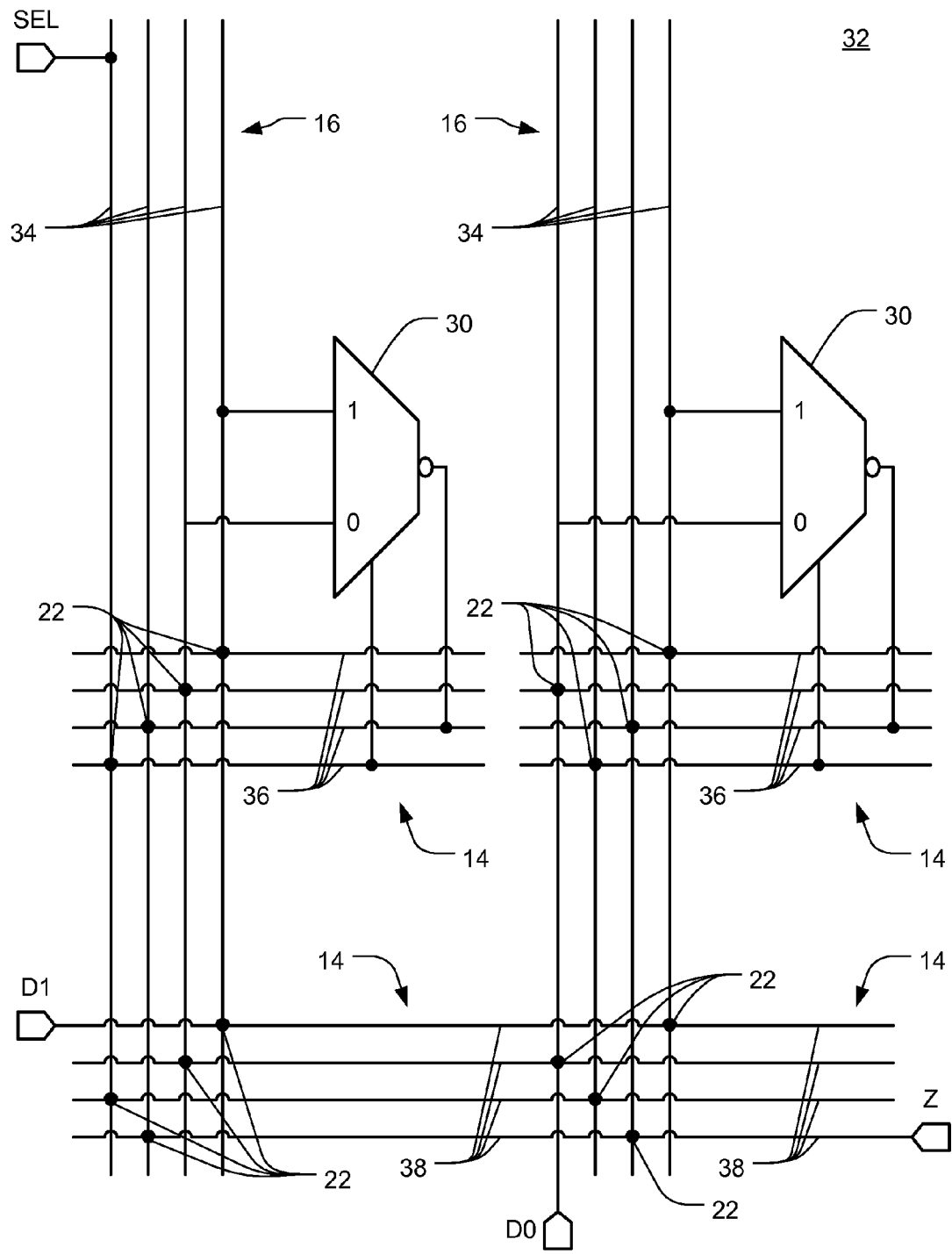
FIG. 5 is a partial schematic diagram of the logic shown in FIG. 4 but rearranged to illustrate the use of horizontal and vertical routing tracks and vias.

FIG. 5 is a partially schematic diagram of the exemplary high-drive logic device shown in FIG. 4 but rearranged to illustrate the use of horizontal and vertical routing tracks 14,16 and vias 22. As illustrated therein, the inputs D0, D1 and SEL are routed to the respective MUXs 30 from sources (typically, other cells 20) using a combination of horizontal and vertical routing tracks 14,16 and vias 22 to make connections therebetween. Notably, the MUXs 30 themselves are represented logically, not physically. As will be apparent to the Ordinary Artisan, the various gates that make up the physical implementation of logic cells 20 are formed from shapes or polygons located in many different mask layers. Similarly, all metal layers, which may for example include one layer in which the horizontal routing tracks 14 are located and another layer in which the vertical routing tracks 16 are located, are represented logically, not physically, although the lines representing these tracks in FIG. 5 are shown in a horizontal and vertical disposition to help illustrate their physical arrangement. Likewise, the details in FIG. 5 of these mask layers such as those commonly referred to as diffusion layers, poly layers, and contact layers, which are predefined based on the ASIC technology and also include some metal layers, are represented logically, not physically.

Figure 6A:
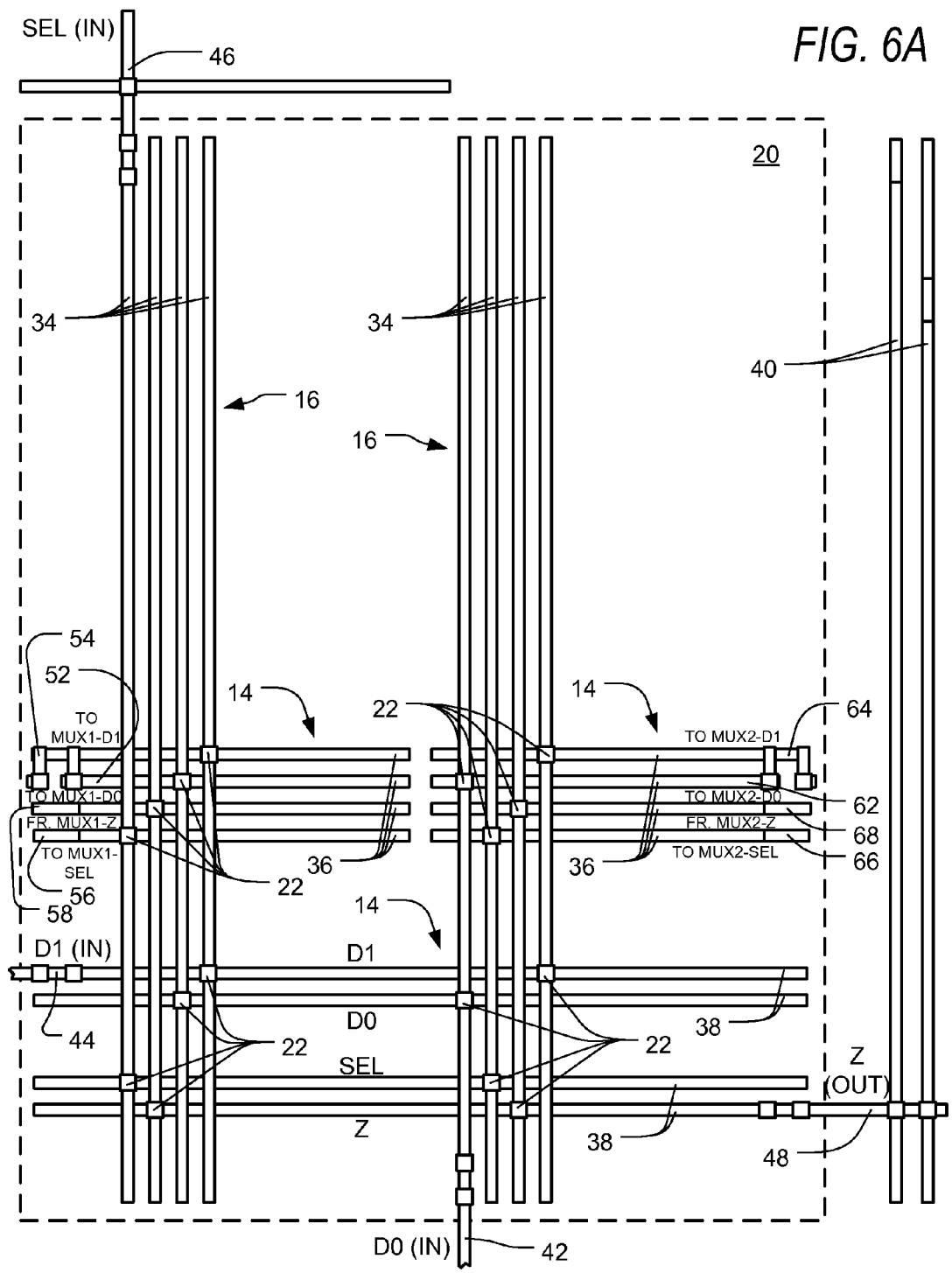
FIG. 6A is a detailed physical diagram of portions of two metal layers in the exemplary logic cell of FIGS. 4 and 5 and the programmed vias that are used to create the high-drive output Z.
Figure 6B:
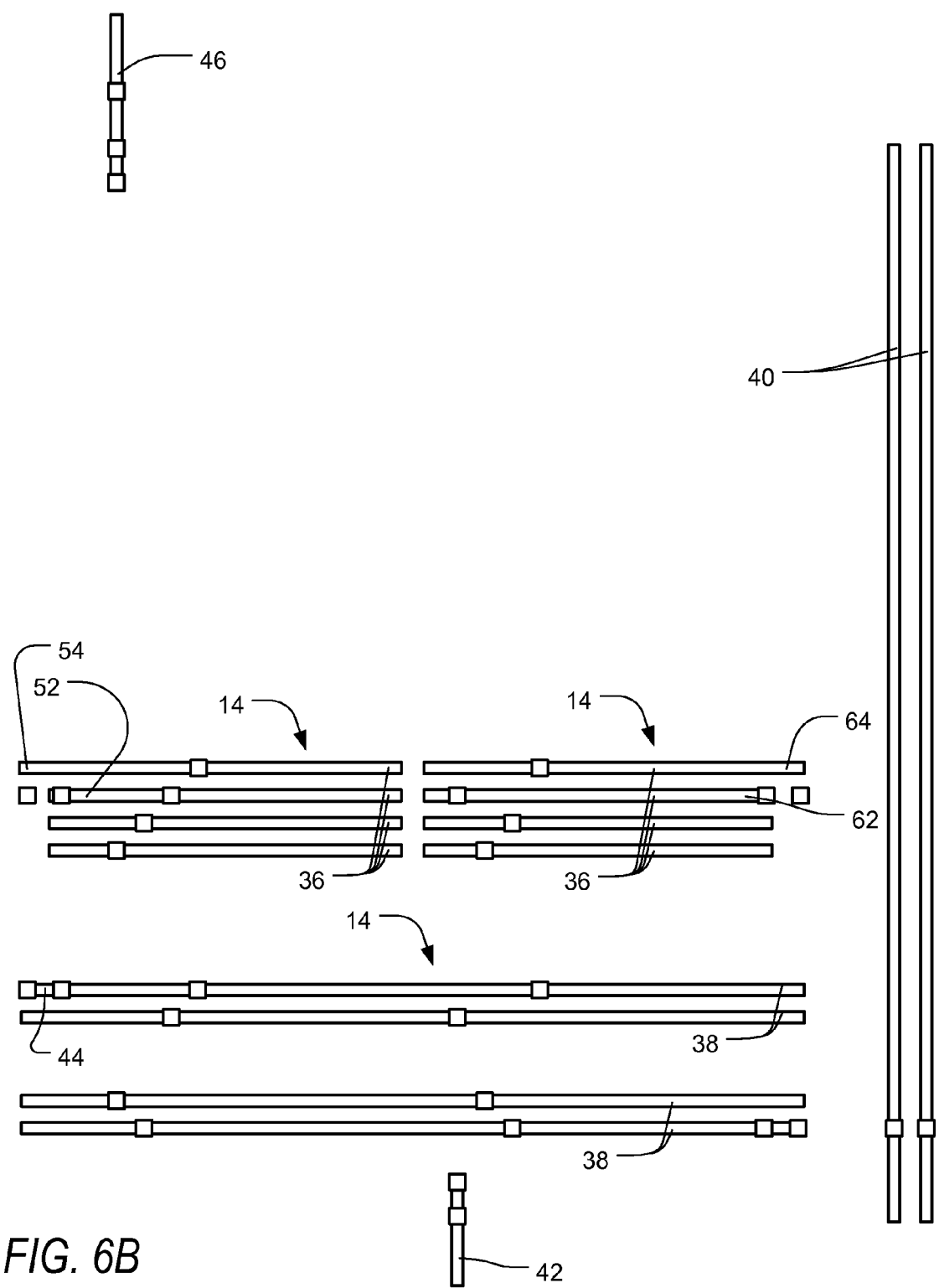
FIG. 6B is a detailed physical diagram of a portion of one of the predefined internal metal layers of FIG. 6A.
Figure 6C:
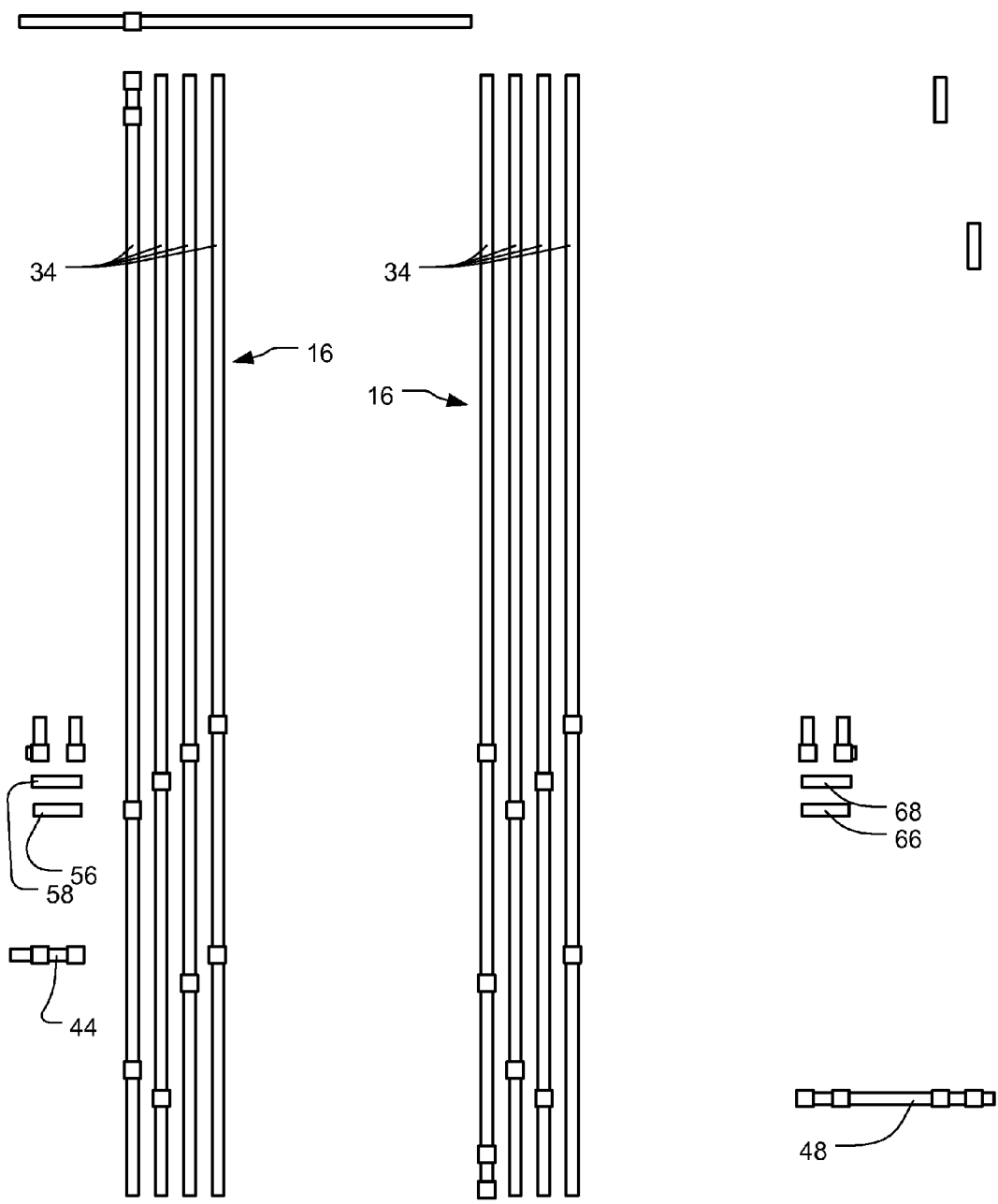
FIG. 6C is a detailed physical diagram of a portion of the other of the predefined internal metal layers of FIG. 6A.

FIG. 6A is a detailed physical diagram of portions of two metal layers in the exemplary logic cell 20 of FIGS. 4 and 5 and the programmed vias 22 that are used to create the high-drive output Z, while FIG. 6B is a detailed physical diagram of a portion of the predefined internal M3 layer in the exemplary logic cell 20, and FIG. 6C is a detailed physical diagram of a portion of the predefined internal M4 layer in the exemplary logic cell 20. In each of FIGS. 6A-6C, the only shapes or polygons shown are those portions of the M3 and M4 layers that are directly involved in the creation of the high-drive output device. The physical inputs to the MUXs, labeled D0, D1, and SEL, correspond to the same logical inputs shown in FIGS. 4 and 5. The shorter horizontal tracks 36 allow each MUX 30 to connect to a separate set of external connections if desired. This is shown logically in FIG. 5. However, if the designer's logic configuration requires a higher drive strength than that which is available from a single MUX 30, then the shorter horizontal tracks 36 may be connected to the vertical tracks 34 using vias 22, and the respective vertical tracks 34 may in turn be connected together using the longer horizontal tracks 38, also using vias 22. These physical connections are all shown in FIG. 6A, while the logical connections may also be seen in FIG. 5.

The resulting high-drive device is thus connected as follows. With reference to FIG. 6A, the D0 input 402 is provided to the exemplary logic cell 20 using a connection at the bottom of FIG. 6A, the D1 input 404 is provided to the exemplary logic cell 20 using a connection at the lower left side of FIG. 6A, and the SEL input is provided to the exemplary logic cell 20 using a connection at the top left of FIG. 6A.

The D0 input 42 is electrically connected directly to a vertical track 34 near the middle of FIG. 6A, and the vertical track 34 is electrically connected to a long horizontal track 38 near the bottom of FIG. 6A using a via 22. The long horizontal track 38 is also electrically connected to a second vertical track 34, also using a via 22. Each vertical track 34 is in turn electrically connected to a short horizontal track 36 that provides a connection 52,62 to a respective MUX (not shown in FIG. 6A).

The D1 input 44 is electrically connected directly to a long horizontal track 38 near the bottom of FIG. 6A, and the long horizontal track 38 is electrically connected to two different vertical tracks 34 using vias 22. Each vertical track 34 is in turn electrically connected to a short horizontal track 36 that provides a connection 54,64 to a respective MUX.

The SEL input 46 is electrically connected directly to a vertical track 34 along the left side of FIG. 6A, and the vertical track 34 is electrically connected to a long horizontal track 38 near the bottom of FIG. 6A using a via 22. The long horizontal track 38 is electrically connected to a second vertical track 34, also using a via 22. Each vertical track 34 is in turn electrically connected to a short horizontal track 36 that provides a connection 56,66 to a different MUX 30.

The respective Z outputs of the two MUXs 30 are connected at connection points 58,68 to separate short horizontal tracks 36, each of which leads to a respective vertical track 34. The vertical tracks 34 are in turn electrically connected to the same long horizontal track 38 near the bottom of FIG. 6A, and that long horizontal track 38 is electrically connected directly to the Z output 48. From there, the Z output 48 may be distributed as desired to other logic cells 20 such as by using the vertical tracks 40 along the right side of FIG. 6A.

Figure 7:
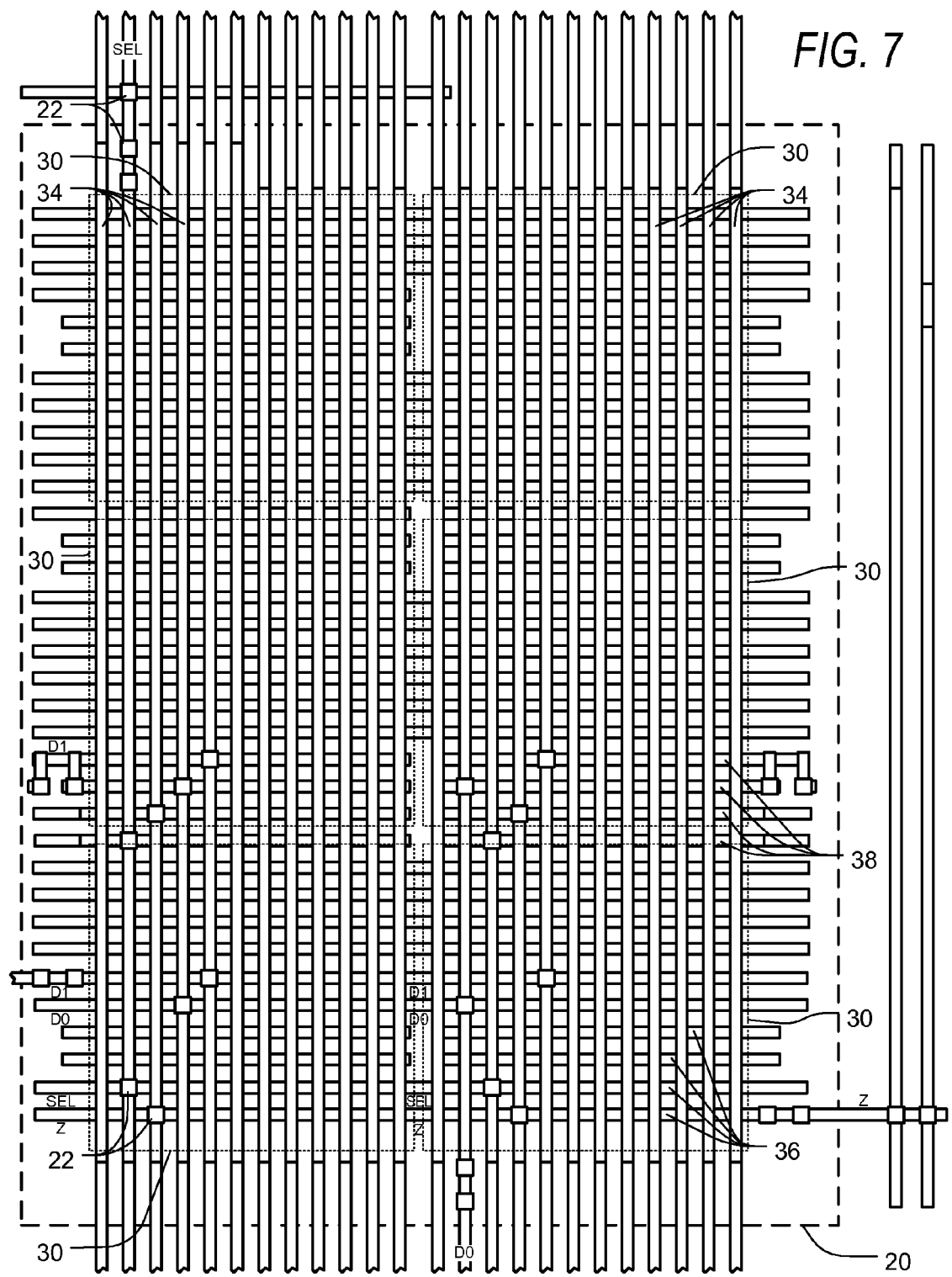
FIG. 7 is a detailed physical diagram of the entirety of the two metal layers in the exemplary logic cell of FIGS. 4 and 5.

FIG. 7 is a detailed physical diagram of the entirety of the two metal layers (M3 and M4) in the exemplary logic cell 20 of FIG. 6A. The exemplary logic cell 20 has 24 vertical routing tracks 34, located in this case in the M3 layer, that span from the top of the cell 20 to the bottom and provide vertical general purpose routing to approximately six logic devices similar in size to the two-input MUX 30 shown schematically in FIG. 3. Alternatively, however, it may be preferable for each logic cell 20 to have a total of 32 vertical routing tracks 34 in order to provide improved connectivity for the various logic devices, particularly if a maximum number of logic devices are disposed in the cell 20. Other numbers of vertical routing tracks may likewise be apparent to the Ordinary Artisan.

As previously seen in FIG. 6A, the horizontal routing tracks 14, located in this case in the M4 layer, are created in two different lengths. The longer horizontal routing tracks 38 span the entire width of the logic cell 20, while the shorter routing tracks 36 span only about half of the width of the logic cell 20, or about the width of one logic device 30 in the cell 20. This permits identical logic devices 30 to be created in pairs such as the two-MUX high-drive logic device 32 of FIG. 4, where the short horizontal routing tracks 36 in the M4 layer are used to connect to separate sets of external connections for the respective logic devices 30, and the long horizontal routing tracks 38 in the M4 layer allow the pair of devices, such as the pair of MUXs 30 in FIG. 4, to be connected together to produce a high-drive output.

It will be understood from FIG. 7 that multiple pairs of logic devices 30 may thus exist in a single logic cell 20. Two or more identical logic devices 30 may be connected to identical inputs and their outputs may be wired together, thereby producing a high-drive functional equivalent (i.e., a higher-order logic device 32 that carries out the same function, using the same inputs, to produce the same output, as the lower-order logic device 30). This may be accomplished merely by modifying the appropriate via layer mask to create vias 22 between the logic devices 30 and the horizontal and vertical routing tracks 14,16, and between the various routing tracks 14,16 as necessary to create the connections shown in FIG. 5. In summary, then, a high-drive logic device, such as the high-drive 2-input MUX logic device 32 of FIGS. 4 and 5, may be produced in a generic ASIC 10 merely by modifying the appropriate via layer mask to create the vias 22 described above, thereby connecting the lower-order logic devices 30 together and creating the appropriate electrical paths in the horizontal and vertical routing tracks 14,16.

Notably, in FIG. 7, the only vias 22 shown are the ones being used to connect the two MUX logic devices 30 to form the high-drive MUX device 32, and the ones being used to provide the connections from the high-drive MUX logic device 32 to other logic cells 20. Although in some instances, the other available logic devices 30 in a logic cell 20 will remain unused, it will be apparent to the Ordinary Artisan that these other available logic devices 30 may be connected together or used separately as desired in a particular ASIC design. Other connections (and in particular, other vias 22) are not shown in FIG. 7 simply for ease in understanding the present invention.

Figure 8:
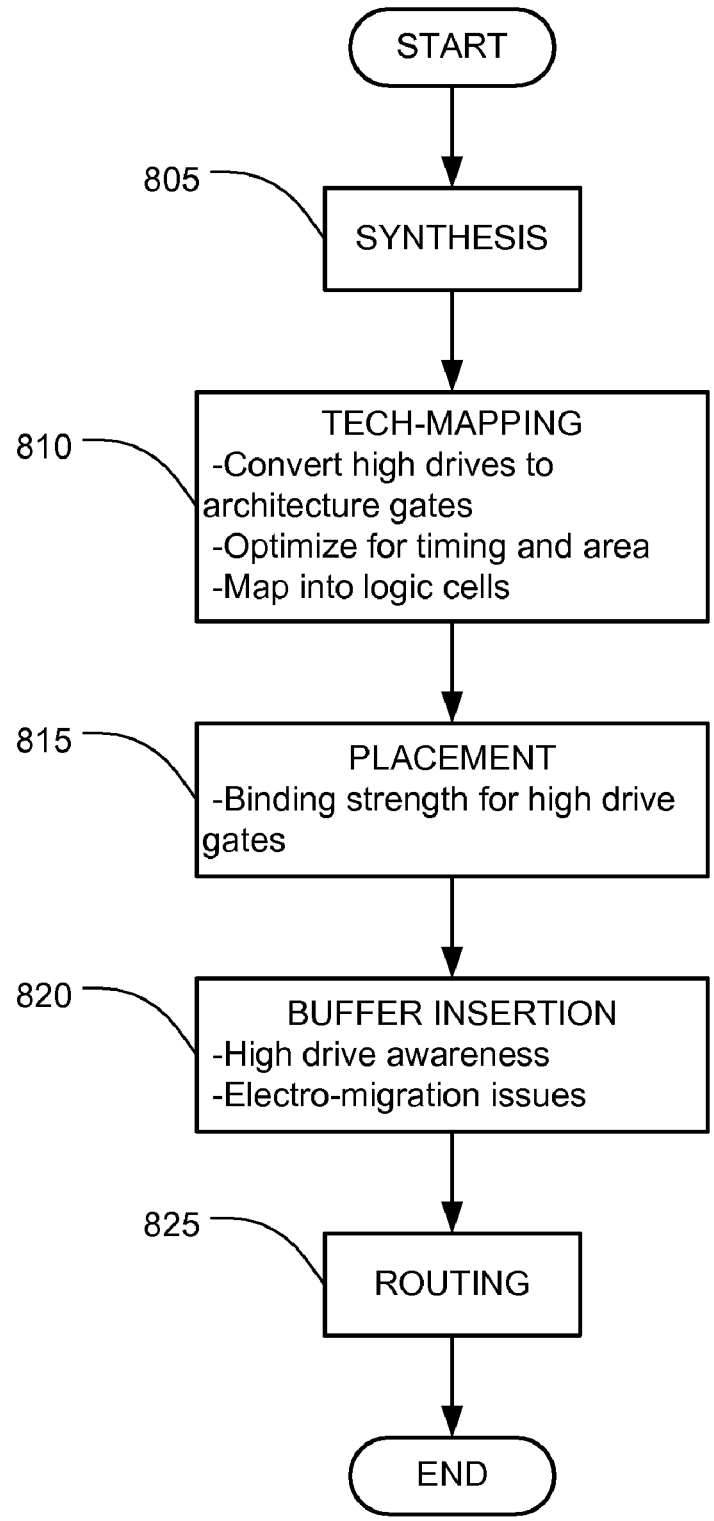
FIG. 8 is a flowchart illustrating the process for determining where high-drive gates are necessary and how they are physically designed into a "one mask" or similar ASIC architecture.

FIG. 8 is a flowchart illustrating the process 800 for physically designing high-drive logic devices into a "one mask" or similar ASIC architecture. This description shows how the steps in this process 800 may be used to arrange logic devices in various logic cells 20 into a semiconductor chip in such a way as to be configurable into a high-drive logic device such as the device 32 shown logically in FIG. 4. Initially, a designer has a logical description of the operation the logic cells 20 must perform. At step 805, a synthesis tool takes the logical description and generates a schematic that may include such logic devices as the two-input MUX 30 of FIG. 3. After the schematic is generated, a technical mapping from the generic schematic preferably occurs at step 810 to create the "one-mask" architecture for, among other cells 20, the logic cell of FIG. 6A that includes logic that may be configured into the high-drive MUX logic device 32 of FIGS. 4 and 5. In the "one-mask" architecture these logic cells 20 may each comprise a sea of NAND gates, which are a commonly-used basic building block that may be configured later to build many other logical devices, including the exemplary MUX logic device 30. In order to provide a designer with the option of using a MUX with double the drive in a one-mask (or two-mask) architecture, two MUXs 30 are preferably mapped into a single logic cell 20. The various logic devices of the cell are built using timing and cell constraints. As will be apparent to the Ordinary Artisan, multiple different implementations may be available, but the actual implementation is preferably selected from the various choices based on heuristics.

The next step 815 in the design is placement. Either manually or using a software tool, the designer may place the logic cell 20 containing the logic devices configurable into the high-drive two-MUX logic device 32 close to those logic cells 20 that receive the high-drive output signal as an input. Preferably, the designer's software-based placement tools contain algorithms that allow tagging of gates with information so that the placement of each potential high-drive gate is in close proximity to the gate it is driving in order to satisfy timing requirements and so that routing congestion can be minimized in these areas. Checks may be applied to ensure the proximity of the logic devices 30 in the high-drive logic device 32 to each other and to the logic devices to which it is connected. Bad placement can lead to signal degradation, integrity problems and higher power dissipation.

After placement, a buffer insertion process occurs at step 820, wherein additional gates are inserted into the design in order to accomplish proper timing and to prevent electromigration problems over vias. Typically, this process involves placing pairs of inverters and the like in determined paths to achieve the foregoing goals. The buffer insertion process is preferably aware of the high-drive gates and adds or removes gates to and from the high drive logic devices 32 as necessary to achieve the goals. Bad buffering can negate the effects of the high-drive devices. Finally, at step 825, the actual routing to, from and between the various logic devices 30,32 and input/output pads 12 is determined. Routing involves the process of finding the most efficient use of the various routing tracks 14,16 to accomplish the desired logical design while meeting all timing constraints and other physical constraints.

A semiconductor chip designed according to the preceding process 800 (that is, having a plurality of logic cells 20 arranged in a plurality of non-customized layers) may then be configured as desired. When use of a high-drive logic device, such as the device 32 of FIG. 4, is desired, two basic logic devices, such as the two logic devices 30 of FIG. 4, may be connected together using the configurable layer or layers of the semiconductor device. More particularly, the two logic devices may be connected, for example, by configuring the via layer between the M3 and M4 layers to connect the appropriate horizontal and vertical routing tracks 14,16 as shown in FIGS. 6A and 7 to achieve the functional logic shown schematically in FIGS. 4 and 5. Alternatively, the two logic devices may be connected by configuring two different via layers, one via layer and one metal layer, or two metal layers. In this way, a one-mask (or two-mask) architecture may be maintained, thereby reducing NRE while still providing the ability to configure a semiconductor chip to provide high-drive functionality.

In at least some embodiments, the present invention may have particular applicability in a technique sometimes referred to as reduced mask or one-mask finishing of advanced wafers. For these products, an initial architecture on an advanced wafer process is used by a wafer fabrication facility ("fab"), and then is held by the fab customer. The cell design of this initial architecture is often referred to as the "macro-cell." A less advanced fab is then used to finish the wafers by configuring the two or single configuration masks. Such a process, split between two types of fabs, is often referred to as a "hybrid process."

A hybrid process has the advantage of low turn-times, low NRE, and high manufacturing flexibility in being able to handle small orders. However, the combination of reduced or one-mask programming and a less advanced process geometry to accommodate the finishing can result in low achievable logic density. More particularly, the fabs in the above example perform two different "generations" or processes. One generation process is used by the first fab and another generation process is used by the second fab. A generation is a set of tools and processes to produce gate array devices with transistors of a specific, minimum size, in terms of physical gate length. For example 0.35-micron, 0.25-micron, 0.18-micron, 0.13-micron, and 90 nm are all well-known generations of processes, in order of less advanced to more advanced, and recent, generations. Generally smaller sizes are more difficult to achieve, but allow for denser logic, translating into devices with more capability. Hybrid devices manufactured according to the method disclosed above will typically be made in two fabs that are at least one, and possibly more generations apart. Typically, the second fab will be an older generation fab. A process is said to have a larger or small geometry if that process would result in, respectively, larger or smaller gate sizes if the process were used to produce gates. If a process is used to etch metal, the geometries and sizes are still referred to the same way, taking into account sizes as if the process were used to produce gates.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A semiconductor device comprising:
a plurality of non-customized layers in which are arranged an array of logic cells, wherein each of at least some of the logic cells in the array includes a first pre-wired logic device and a second pre-wired logic device, the second logic device being functionally equivalent to the first logic device; and
no more than two customized layers, disposed on top of the plurality of non-customized layers, for routing connections, wherein the customized layers configure the first and second pre-wired logic devices into a high-drive logic device, the high-drive logic device being functionally equivalent to each of the first and second logic devices, by connecting the first and second pre-wired logic devices together in parallel.

2. The semiconductor device of claim 1, wherein the device is an application-specific integrated circuit.

3. The semiconductor device of claim 2, wherein the first and second pre-wired logic devices are configured into the high-drive logic device using only one customized layer.

4. The semiconductor device of claim 3, wherein the one customized layer is a customized via layer.

5. The semiconductor device of claim 4, wherein the first pre-wired logic device is selected from a group consisting of a NAND, a multiplexer, a FLOP, an inverter, an XOR, a NOR, and a look-up table, and the second pre-wired logic device is substantially the same as the first pre-wired logic device.

6. The semiconductor device of claim 5, wherein the first and second pre-wired logic devices are each a multiplexer having a D0 input, a D1 input, a SEL input, and a Z output, and wherein the first and second pre-wired logic devices are configured, using the customized via layer, to be connected to a common D0 input, a common D1 input, a common SEL input, and a common Z output.

7. The semiconductor device of claim 2, wherein the customized layers include two customized via layers.

8. The semiconductor device of claim 2, wherein the customized layers include one customized via layer and one customized metal layer.

9. The semiconductor device of claim 2, wherein the customized layers include two customized metal layers.

10. The semiconductor device of claim 2, wherein the array of logic cells are fabricated in a first process geometry, and wherein the customized layers are fabricated in a second process geometry.

11. A method of making a semiconductor device, the method comprising:
forming a plurality of non-customized layers in which are arranged an array of logic cells, wherein each of at least some of the logic cells in the array includes a first pre-wired logic device and a second pre-wired logic device, the second logic device being functionally equivalent to the first logic device; and
forming no more than two customized layers, for routing connections, on top of the plurality of non-customized layers, the step of forming the customized layers including:
producing a respective customized mask for each customized layer, the customized masks for configuring the first and second pre-wired logic devices into a high-drive logic device, the high-drive logic device being functionally equivalent to each of the first and second logic devices, by connecting the first and second pre-wired logic devices together in parallel, and
forming each of the no more than two customized layers using the respective customized mask.

12. The method of claim 11, wherein the device is an application-specific integrated circuit.

13. The method of claim 12, wherein only one customized mask is produced and wherein only one customized layer is formed, using the one customized mask, to configure the first and second pre-wired logic devices into the high-drive logic device that is functionally equivalent to each of the first and second logic devices.

14. The method of claim 13, wherein the customized mask that is produced is a customized via layer, and wherein forming the customized via layer includes forming connections between routing tracks in non-customized layers.

15. The method of claim 14, wherein forming the plurality of non-customized layers includes:
selecting the first pre-wired logic device from a group consisting of a NAND, a multiplexer, a FLOP, an inverter, an XOR, a NOR, and a look-up table, and
selecting the second pre-wired logic device to be the same type of device as the first logic device.

16. The method of claim 15, wherein each of the first and second pre-wired logic devices is a multiplexer having a D0 input, a D1 input, a SEL input, and a Z output, and wherein forming the customized via layer includes connecting the first and second pre-wired logic devices to a common D0 input, a common D1 input, a common SEL input, and a common Z output.

17. The method of claim 12, wherein forming no more than two customized layers includes forming two customized via layers.

18. The method of claim 12, wherein forming no more than two customized layers includes forming one customized via layer and one customized metal layer.

19. The method of claim 12, wherein forming no more than two customized layers includes forming two customized metal layers.

20. The method of claim 12, wherein forming the plurality of non-customized layers includes fabricating the plurality of non-customized layers in a first process geometry, and wherein forming the no more than two customized layers includes fabricating the no more than two customized layers in a second process geometry.

21. A semiconductor chip, comprising an array of logic cells, arranged in a plurality of non-customized layers, that are disposed to receive configurable metal, at least some of the logic cells in the array including a first pre-wired logic device and a second pre-wired logic device, the second logic device being functionally equivalent to the first logic device, wherein the first and second pre-wired logic devices in each logic cell can be selectively connected together in parallel to form a high-drive logic device, functionally equivalent to each of the first and second logic devices, by routing in no more than two customized layers in the configurable metal.

22. The semiconductor chip of claim 21, wherein the chip is part of an application-specific integrated circuit.

23. The semiconductor chip of claim 22, wherein the first and second pre-wired logic devices can be selectively connected together in parallel to form a high-drive logic device using only one customized layer.

24. The semiconductor chip of claim 23, wherein the first and second pre-wired logic devices can be selectively connected together in parallel to form the high-drive logic device using only one customized layer, the one customized layer being a via layer.

25. The semiconductor chip of claim 24, wherein the first pre-wired logic device is selected from a group consisting of a NAND, a multiplexer, a FLOP, an inverter, an XOR, a NOR, and a look-up table, and the second pre-wired logic device is substantially the same as the first pre-wired logic device.

26. The semiconductor chip of claim 25, wherein the first and second pre-wired logic devices are each a multiplexer having a D0 input, a D1 input, a SEL input, and a Z output, and wherein the first and second pre-wired logic devices can be selectively connected together in parallel, using the customized via layer, such that the first and second pre-wired logic devices are connected to a common D0 input, a common D1 input, a common SEL input, and a common Z output.

27. The semiconductor chip of claim 22, wherein the first and second pre-wired logic devices can be selectively connected together in parallel to form a high-drive logic device using only two customized via layers.

28. The semiconductor chip of claim 22, wherein the first and second pre-wired logic devices can be selectively connected together in parallel to form a high-drive logic device using only one customized via layer and one customized metal layer.

29. The semiconductor chip of claim 22, wherein the first and second pre-wired logic devices can be selectively connected together in parallel to form a high-drive logic device using only two customized metal layers.

30. The semiconductor chip of claim 22, wherein the array of logic cells is fabricated in a first process geometry, and wherein the configurable metal of the customized layers can be fabricated in a second process geometry.

* * * * *